(12) United States Patent
Wong et al.

(10) Patent No.: US 7,178,711 B2
(45) Date of Patent: Feb. 20, 2007

(54) METHOD AND DEVICE TO ELONGATE A SOLDER JOINT

(75) Inventors: Ee Hua Wong, Singapore (SG); Ranjan Rajoo, Singapore (SG); Wai Kwan Wong, Singapore (SG); Mahadevan Krishna Iyer, Singapore (SG)

(73) Assignees: Agency for Science, Technology and Research, Singapore (SG); National Univeristy of Singapore, Singapore (SG); Georgia Tech Research Corporation, Atlanta, GA (US)

( * ) Notice: Subject to any disclaimer, the term of this patent is extended or adjusted under 35 U.S.C. 154(b) by 133 days.

(21) Appl. No.: 10/667,008

(22) Filed: Sep. 17, 2003

(65) Prior Publication Data

US 2005/0056684 A1  Mar. 17, 2005

(51) Int. Cl.
  *B23K 31/02*  (2006.01)
(52) U.S. Cl. .................................................. 228/157
(58) Field of Classification Search ................. 228/157, 228/19
See application file for complete search history.

(56) References Cited

U.S. PATENT DOCUMENTS

| | | | | |
|---|---|---|---|---|
| 4,878,611 A | * | 11/1989 | LoVasco et al. | 228/180.22 |
| 5,284,796 A | * | 2/1994 | Nakanishi et al. | 438/108 |
| 5,306,669 A | * | 4/1994 | Fujihira et al. | 438/125 |
| 5,632,434 A | * | 5/1997 | Evans et al. | 228/44.7 |
| 5,762,744 A | * | 6/1998 | Shibata et al. | 156/235 |
| 5,964,396 A | * | 10/1999 | Brofman et al. | 228/180.22 |
| 5,968,670 A | * | 10/1999 | Brofman et al. | 428/576 |
| 5,975,409 A | * | 11/1999 | Brofman et al. | 228/180.22 |

* cited by examiner

*Primary Examiner*—Jonathan Johnson
(74) *Attorney, Agent, or Firm*—Martine Penilla & Gencarella, LLP (57) ABSTRACT

A method and device to elongate a solder joint are provided. The method begins by forming an elongator on a first substrate. The elongator comprises an expander and an encapsulant to encapsulate the expander. A solder joint is formed to connect the first substrate to a second substrate. Thereafter, the encapsulant is softened to release the expander from a compressed state to elongate the solder joint. The device to elongate a solder joint comprises a substrate having an elongator formed on it. The elongator includes an expander in a compressed state and an encapsulant to encapsulate the expander.

12 Claims, 10 Drawing Sheets

METHOD AND DEVICE TO ELONGATE A SOLDER JOINT

BACKGROUND OF THE INVENTION

1. Field of the Invention

The present invention relates generally to solder joints. More particularly, the present invention relates to a method and device to elongate a solder joint.

2. Description of the Related Art

A solder joint is formed when a solder deposit between two substrates is subjected to reflow soldering. During reflow soldering, the solder deposit is heated such that it melts and wets a solderable surface on a substrate. The solder deposit solidifies upon subsequent cooling, forming the solder joint.

Solder joints serve two functions in an electronic assembly; they provide mechanical support to hold various components in the electronic assembly together and electrical support to form electrical connections within a circuit. Examples of solder joints include chip-to-interposer connections such as controlled collapse chip connections (C4 joints), package-to-board connections in, for example, Surface Mount Technology (SMT), and chip-to-board connections such as in chip-on-board (COB) technology.

During field application, the electronic assembly undergoes a temperature cycle each time it powers on or off. Due to differences in coefficients of thermal expansion (CTEs), substrates in the electronic assembly expand and contract to different degrees during the temperature cycle. This differential expansion and contraction of the substrates results in a movement of one end of a solder joint relative to another, which puts a strain on the solder joint. Because the electronic assembly undergoes numerous temperature cycles over its service life, the solder joints are subjected to repeated applications of strain, resulting in fatigue failure of the solder joints, which shortens the service life of the electronic assembly.

Studies have shown that the fatigue life of a solder joint, that is, the number of applications of strain that a solder joint can sustain before fatigue failure, can be improved by elongating the solder joint. An elongated solder joint is more compliant and is therefore better able to absorb the strain caused by the temperature cycling. Consequently, various methods to elongate a solder joint have been proposed.

One such method is disclosed in U.S. Pat. No. 4,545,610 issued to Lakritz, et al, wherein a solder extender on a substrate is positioned over a solder mound on a semiconductor chip and reflowed to form an elongated solder joint. A spacer is used to maintain a predetermined spacing between the semiconductor chip and the substrate.

A drawback of this method is that it involves numerous processing steps. Each processing step increases the complexity of the manufacturing process and adds to the cost of production. In particular, the processing steps involving the use of vapour deposition techniques to form the solder extender on the substrate and then to deposit a layer of low melting metal onto a top surface of the solder extender make this method of elongating a solder joint expensive.

In addition, because the probability of defects occurring in the solder joint increases with each processing step, the reliability of an elongated solder joint formed with this method is compromised.

Another method for elongating a solder joint is disclosed in U.S. Pat. No. 5,968,670 issued to Brofman, et al. In this method, the solder joint is elongated when a spring, restrained in a compressed state by solder, is released during solder reflow.

Unfortunately, this method also involves numerous processing steps which, as discussed previously, increase the complexity of the manufacturing process and the cost of production, and reduce the reliability of the solder joint.

Additionally, because some of the components involved in this method are of an infinitesimal dimension, the handling of these components poses a problem. For example, it is difficult to manipulate the tiny spring into a suitable orientation for insertion into a minute cavity in a graphite boat mold to form an expandable solder bump. This difficulty in the handling of the components contributes to the complexity of the process.

In view of the foregoing, it is desirable to have a method for elongating a solder joint that involves a minimal number of processing steps. It is also desirable to have a method that does not involve the handling of minute components.

SUMMARY OF THE INVENTION

The present invention fills these needs by providing a method and device to elongate a solder joint. It should be appreciated that the present invention can be implemented in numerous ways, including as a process, an apparatus, a system, a device or a method. Several inventive embodiments of the present invention are described below.

One embodiment of the present invention provides a method to elongate a solder joint. The method begins by forming an elongator on a first substrate. The elongator comprises an expander and an encapsulant to encapsulate the expander. A solder joint is formed to connect the first substrate to a second substrate. Thereafter, the encapsulant is softened to release the expander from a compressed state to elongate the solder joint.

The elongator may be formed on the first substrate by providing a mold having a first mold cavity and a second mold cavity. The first substrate is disposed in the first mold cavity, while an expander is disposed in the second mold cavity. The expander is compressed and an encapsulant is introduced into the mold to encapsulate the expander to form the elongator on the first substrate.

The first substrate may be one of group consisting of a chip, an interposer, a package, a board, a series of interposers, a series of packages and a wafer. The first substrate may be subjected to singulation.

The elongator may be formed on the first substrate by one of a group consisting of an injection molding process, a compression molding process, a transfer molding process and a casting process.

The solder joint to connect the first substrate to the second substrate may be formed by melting a plurality of solder deposits to wet a solderable surface to form the solder joint.

The encapsulant is preferably an electrical insulator. More preferably, the encapsulant is a thermoplastic such as polyamide or polyacetal. Most preferably, the thermoplastic has a softening temperature of approximately 40° C. higher than a melting point of the plurality of solder deposits.

The expander may be a corrugated strip. Preferably, a first end of the corrugated strip overlaps a second end of the corrugated strip.

In another embodiment of the invention, a device to elongate a solder joint is provided. The device to elongate a solder joint comprises a substrate having an elongator formed on it. The elongator includes an expander in a compressed state and an encapsulant to encapsulate the expander.

The substrate may be one of a group consisting of a chip, an interposer, a package, a board, a series of interposers, a series of packages and a wafer.

In yet another embodiment of the invention, an electronic assembly is provided. The electronic assembly comprises a first substrate coupled to a second substrate by a solder joint and an elongator coupled between the first substrate and the second substrate. The elongator, which comprises an expander and an encapsulant to encapsulate the expander, is formed on the first substrate.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

A method and device to elongate a solder joint are provided. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
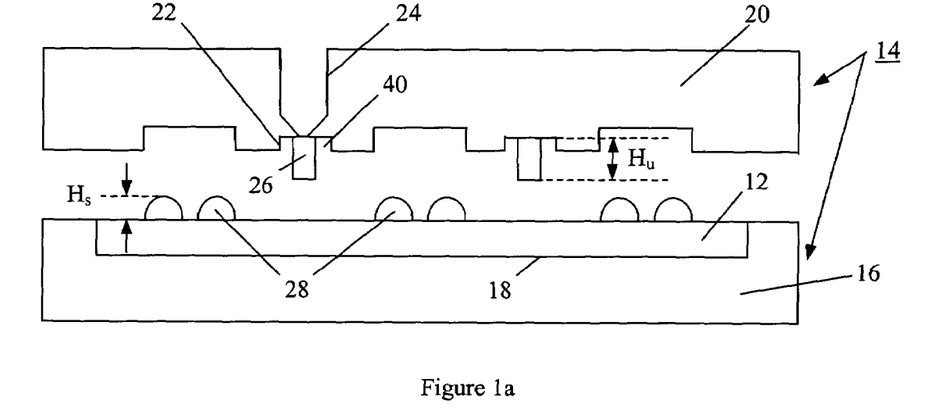
FIGS. 1a to 1c illustrate a method to form an elongator on a substrate in accordance with one embodiment of the present invention.
Figure 1B:
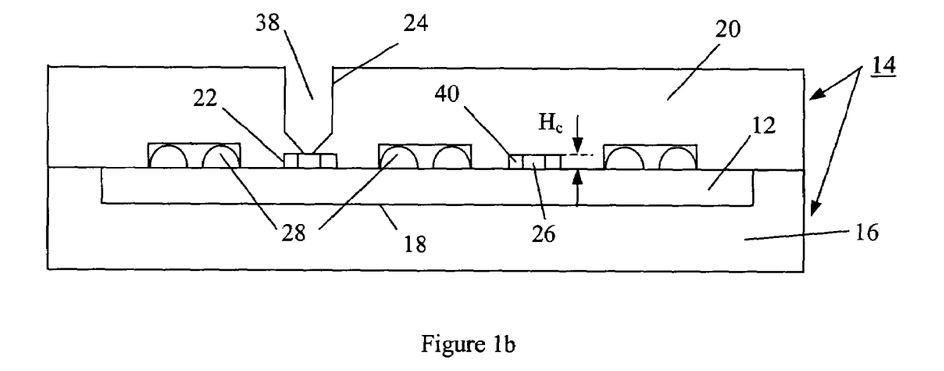
Figure 1C:
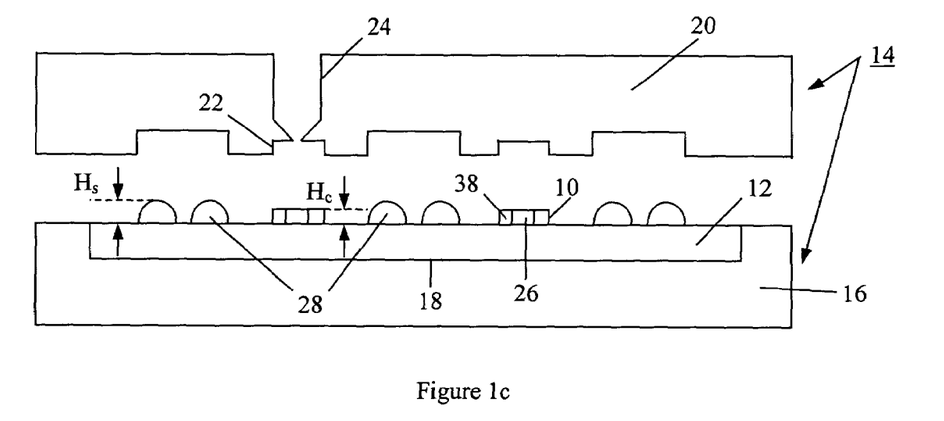

FIGS. 1a to 1c illustrate a method to form an elongator 10 on a substrate 12 in accordance with one embodiment of the present invention. A mold 14 to form elongator 10 on substrate 12 is illustrated in FIG. 1a. Mold 14 comprises a first mold half 16 having a first mold cavity 18, a second mold half 20 having a second mold cavity 22, and a nozzle 24. Substrate 12 is disposed in first mold cavity 18, while an expander 26 is disposed in second mold cavity 22.

Substrate 12 may be a chip, an interposer, a package or a board. In this embodiment, substrate 12 includes a plurality of solder deposits 28 with a height $H_s$. In an alternative embodiment, substrate 12 may include a solderable surface.

Figure 2A:
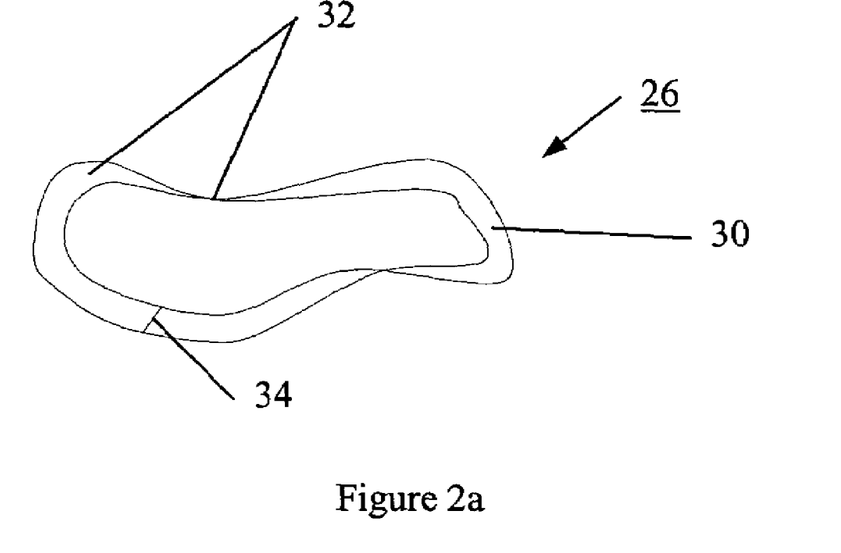
FIG. 2a illustrates a perspective view of an expander in accordance with one embodiment of the present invention.
Figure 2B:
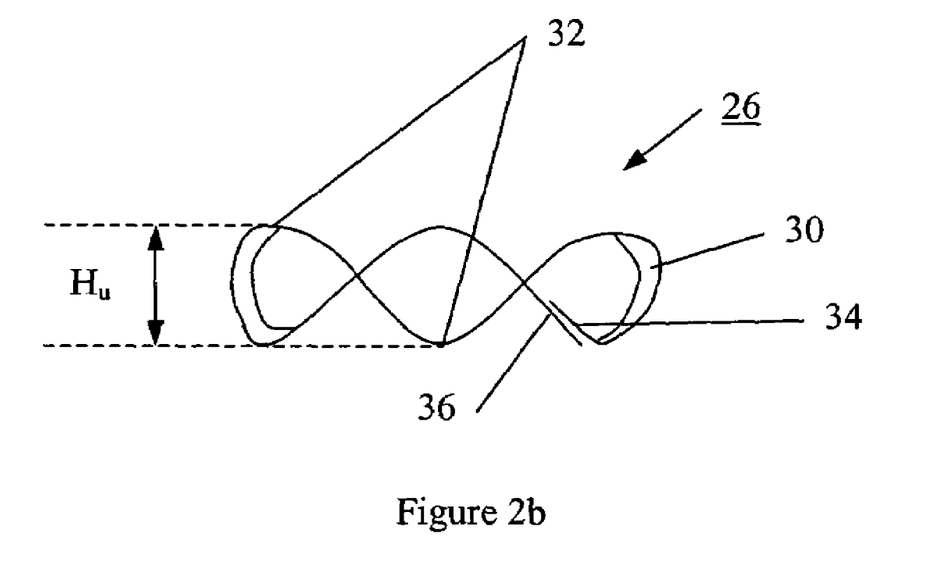
FIG. 2b illustrates a side view of an expander in accordance with one embodiment of the present invention.

FIGS. 2a and 2b illustrate a perspective view and a side view, respectively, of expander 26 in accordance with one embodiment of the present invention. Expander 26 comprises a corrugated strip 30.

An alternating series of grooves and ridges 32 in corrugated strip 30 confers a quality of resilience to corrugated strip 30. Accordingly, expander 26 is of an uncompressed height $H_u$ as illustrated in FIG. 2b. Uncompressed height $H_u$ of expander 26 may correspond to a desired height $H_d$ of a solder joint.

A first end 34 of corrugated strip 30 may overlap a second end 36 of corrugated strip 30, as shown in FIG. 2b, to accommodate a compression of expander 26. Alternatively, a spacing (not illustrated) may be provided between first end 34 and second end 36 of corrugated strip 30 to accommodate the compression of expander 26.

Corrugated strip 30 may be economically manufactured by stamping out of a sheet of metal such as stainless steel. A desired resilience of expander 26 may be achieved by selecting an appropriate material and suitable dimensions, in terms of length, width and thickness, for corrugated strip 30. A geometry of corrugated strip 30 may correspond to an area on substrate 12 which is not populated by the plurality of solder deposits 28 or a solderable surface.

Other embodiments of expander 26 include a linear compression spring and other resilient devices.

With reference to FIG. 1b, expander 26 is compressed to a height $H_c$ and brought into contact with substrate 12 when first mold half 16 is brought into contact with second mold half 20. Compressed height $H_c$ of expander 26 is preferably less than height $H_s$ of the plurality of solder deposits 28.

An encapsulant 38 in a molten state is injected into mold 14 through nozzle 24. Encapsulant 38 fills up a space 40 in second mold cavity 22 around expander 26.

Encapsulant 38 has a softening temperature that is approximately 40° C. higher than a melting point of the plurality of solder deposits 28. Such a softening temperature allows encapsulant 38 to remain rigid at a solder reflow temperature, that is, a temperature at which the plurality of solder deposits 28 is melted to form a solder joint, while softening at a temperature of approximately 10° C. above the solder reflow temperature.

Encapsulant 38 is preferably an electrical insulator such as a thermoplastic to prevent elongator 10 from short-circuiting the solder joint. Additionally, by eliminating the risk of short-circuiting, a larger volume of encapsulant 38 may be used to encapsulate expander 26. The larger volume of encapsulant 38 provides a degree of structural reinforcement against stress and strain to the solder joint during temperature cycling and also against mechanical shock, thereby enhancing the reliability of the solder joint. Examples of suitable thermoplastic encapsulants include polyamide and polyacetal.

Mold 14 is allowed to cool once space 40 is filled. Upon cooling, encapsulant 38 solidifies, forming elongator 10 with expander 26. Expander 26 is restrained in a compressed state by encapsulant 38. Consequently, elongator 10 is of a height $H_c$ corresponding to height $H_c$ of compressed expander 26.

First mold half 16 is then separated from second mold half 20 as illustrated in FIG. 1c. Thereafter, substrate 12 with elongator 10 affixed thereto is removed from first mold cavity 18.

The use of an injection molding process is advantageous in that the injection molding process provides a quick and economical way of forming elongator 10 on substrate 12. Although the injection molding process is used to form elongator 10 on substrate 12 in this embodiment, other processes such as compression molding, transfer molding and casting may also be employed.

Figure 3:
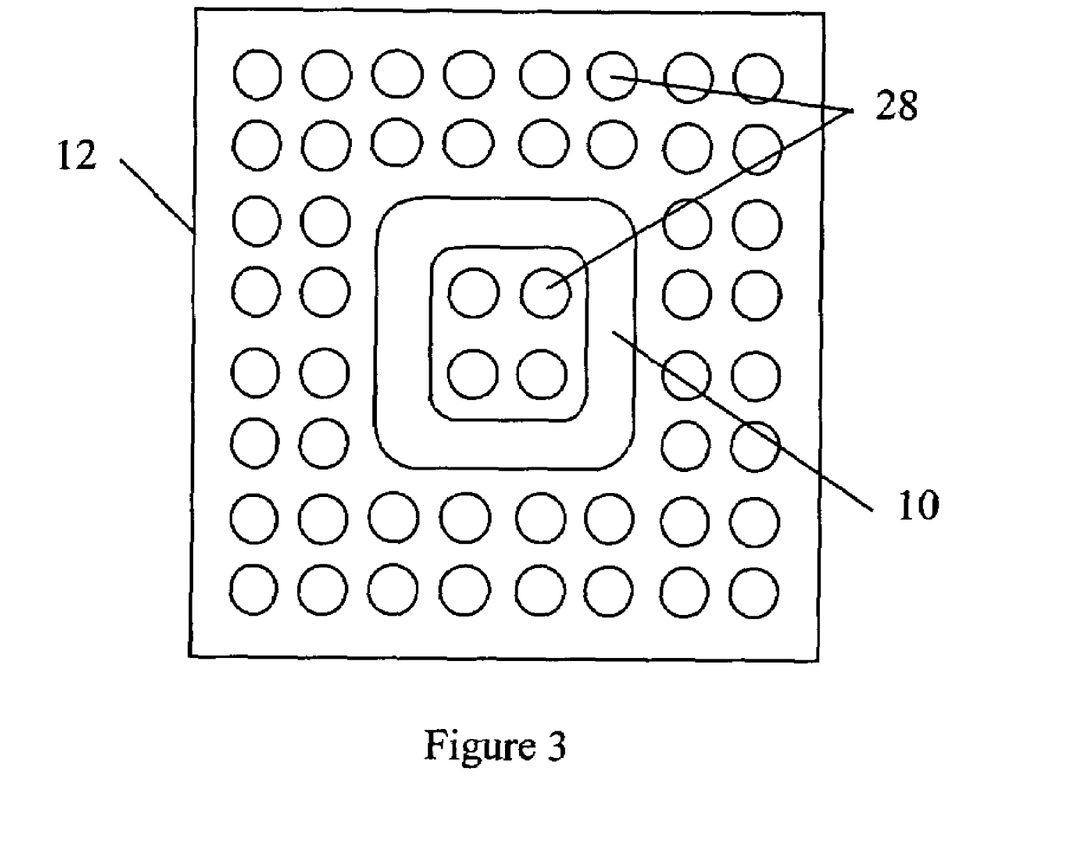
FIG. 3 illustrates a plan view of a substrate with an elongator affixed thereto in accordance with one embodiment of the present invention.

FIG. 3 illustrates a plan view of substrate 12 with elongator 10 affixed thereto in accordance with one embodiment of the present invention. Elongator 10 is coupled to an area on substrate 12 that is not populated by the plurality of solder deposits 28. Accordingly, the geometry of elongator 10 may correspond to an area on substrate 12 that is not populated by the plurality of solder deposits 28.

Similarly, in the alternative embodiment where substrate 12 includes a solderable surface, elongator 10 will be coupled to an area on substrate 12 that is not populated by the solderable surface. Accordingly, the geometry of elongator 10 may correspond to such an area.

Figure 4A:
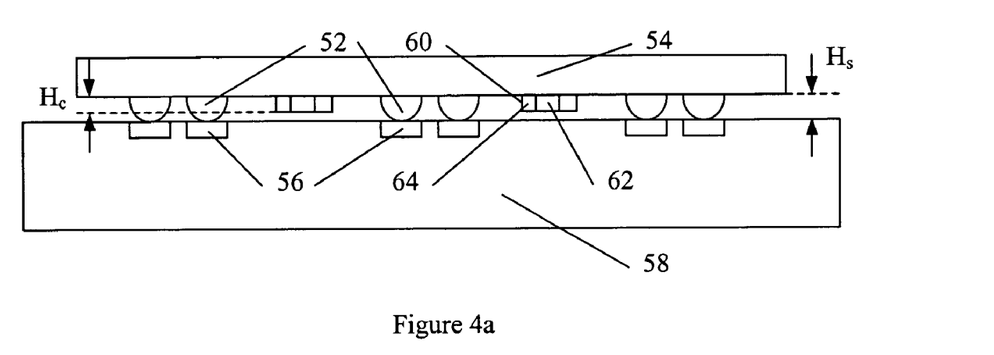
FIGS. 4a to 4c illustrate a method to elongate a solder joint in accordance with one embodiment of the present invention.
Figure 4B:
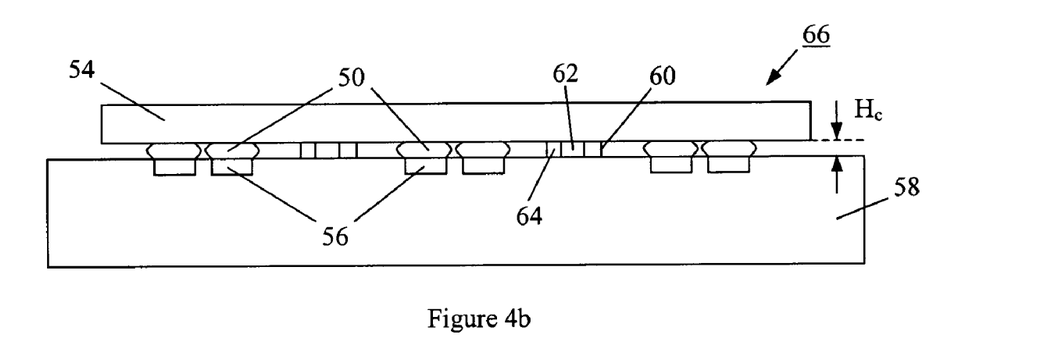
Figure 4C:
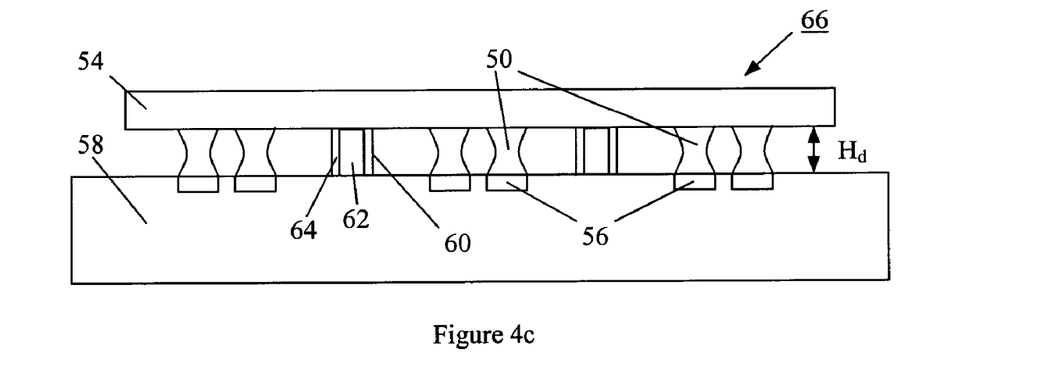

FIGS. 4a to 4c illustrate a method to elongate a solder joint 50 in accordance with one embodiment of the present invention. Referring first to FIG. 4a, a plurality of solder deposits 52 on a first substrate 54 is positioned to oppose a solderable surface 56 on a second substrate 58. An elongator 60 is formed on first substrate 54. In an alternative embodiment, elongator 60 may be formed on second substrate 58.

Elongator 60 comprises an expander 62 encapsulated by an encapsulant 64. Expander 62 is restrained in a compressed state by encapsulant 64. Expander 62 may be a corrugated strip, a linear compression spring or other resilient devices. Encapsulant 64 has a softening temperature that is approximately 40° C. higher than a melting point of the plurality of solder deposits 52 and is preferably an electrical insulator such as polyamide or polyacetal.

First substrate 54 may be a chip or a package. Correspondingly, second substrate 58 may be an interposer or a board depending on a desired assembly. For example, in an instance where first substrate 54 is a chip, second substrate 58 may be an interposer or a board. Accordingly, solder joint 50 forms a chip-to-interposer or a chip-to-board connection, respectively, between first substrate 54 and second substrate 58.

Heat may be applied to melt the plurality of solder deposits 52 via a reflow process. At a solder reflow temperature, that is, a temperature above the melting point of the plurality of solder deposits 52, each of the plurality of solder deposits 52 melts and wets a corresponding solderable surface 56 to form solder joint 50 as illustrated in FIG. 4b. Solder joint 50 couples first substrate 54 to second substrate 58 to form an electronic assembly 66.

Because the softening temperature of encapsulant 64 is higher than the solder reflow temperature, encapsulant 64 remains sufficiently rigid to prevent a release of expander 62 from its compressed state.

Electronic assembly 66 is then subjected to further heating to raise the reflow temperature to the softening temperature of encapsulant 64. At the softening temperature, encapsulant 64 begins to soften.

As encapsulant 64 softens, expander 62 is gradually released from its compressed state, resulting in a gradual elongation of solder joint 50. The rate at which solder joint 50 elongates depends on the compliance of expander 62 and the viscosity of encapsulant 64. The use of a more compliant expander 62 and a more viscous encapsulant 64 will result in a slower release of expander 62 from its compressed state, and a correspondingly slower rate of elongation.

With reference to FIG. 4c, electronic assembly 66 is cooled when solder joint 50 attains a desired height $H_d$. Upon cooling, solder joint 50 and encapsulant 64 solidify. Elongator 60 serves as a reinforcement for solder joint 50, increasing its resistance to stress and strain caused by temperature cycling and also to mechanical shock, thereby enhancing the reliability of solder joint 50.

Figure 5A:
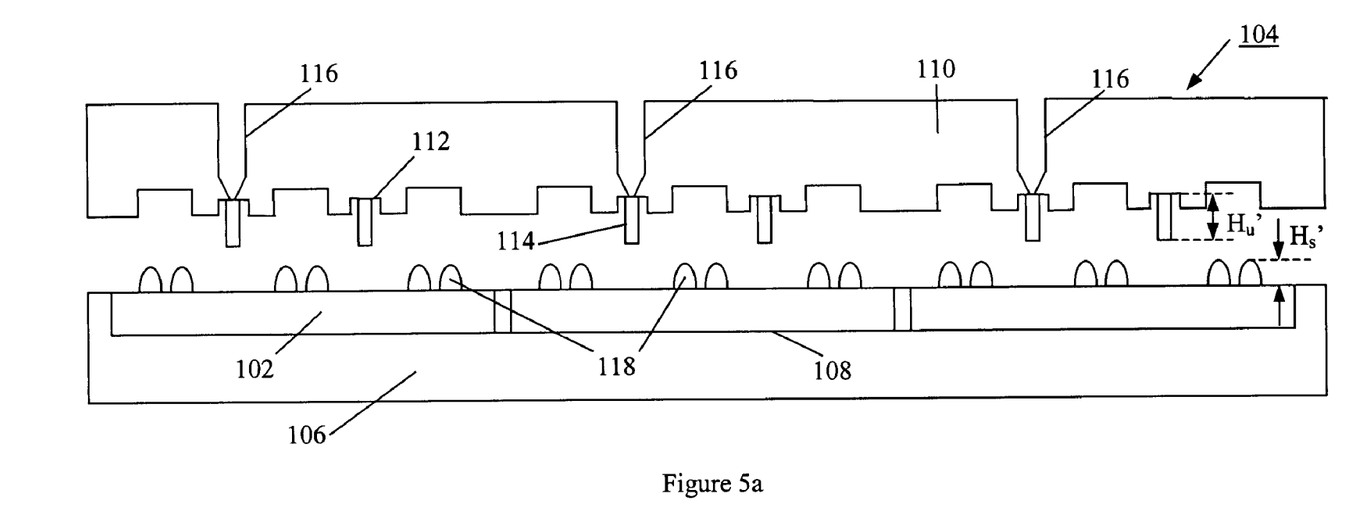
FIGS. 5a to 5c illustrate a method to form an elongator on a substrate in accordance with another embodiment of the present invention.
Figure 5B:
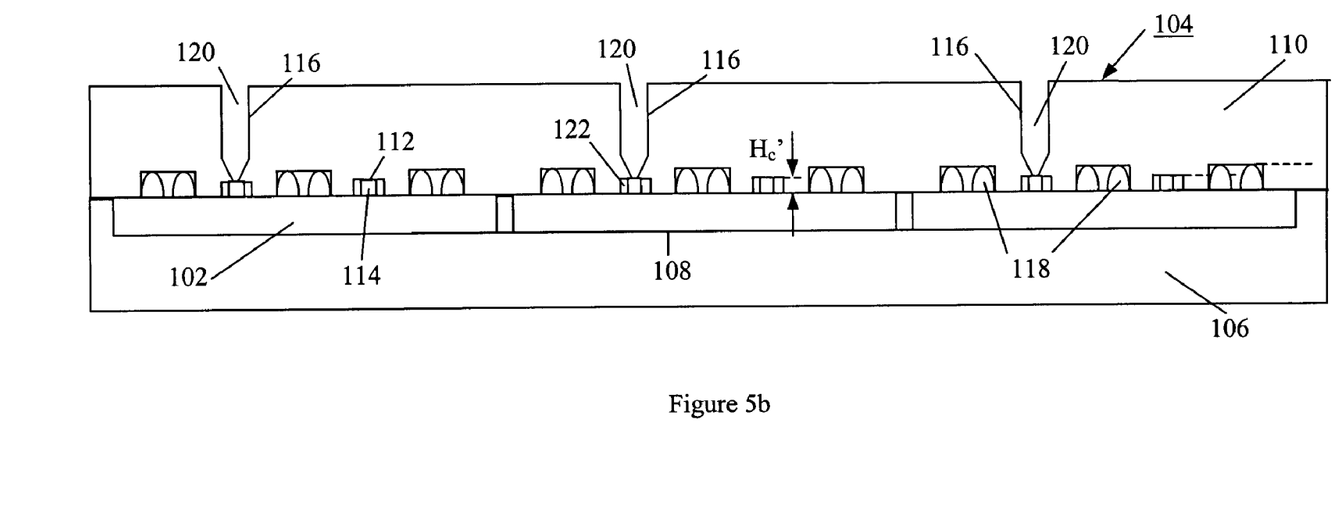
Figure 5C:
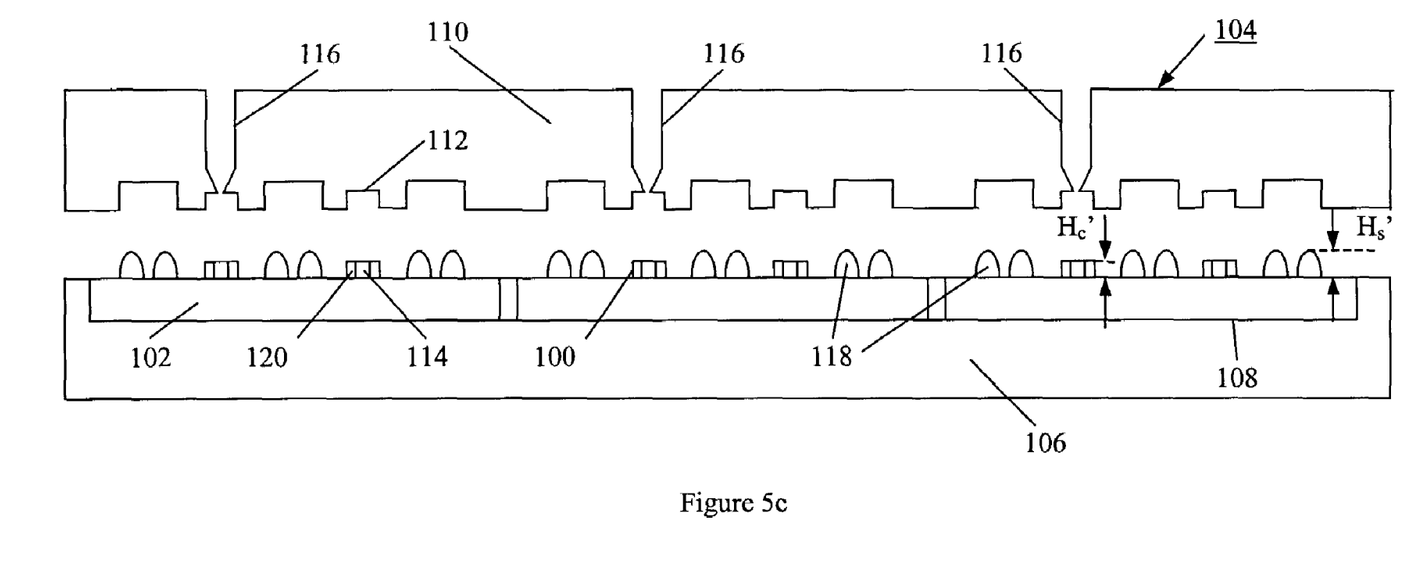

FIGS. 5a to 5c illustrate a method to form an elongator 100 on a substrate 102 in accordance with another embodiment of the present invention. A mold 104 to form elongator 100 on substrate 102 is illustrated in FIG. 5a. Mold 104 comprises a first mold half 106 having a first mold cavity 108 and a second mold half 110 having a second mold cavity 112. Substrate 102 is disposed in first mold cavity 108, while an expander 114 is disposed in second mold cavity 112.

Substrate 102 may be a series of interposers, a series of packages or a wafer with a plurality of chips. Process efficiency is improved by mass-producing elongator 100 on substrate 102. Second mold cavity 112 is designed to accommodate a corresponding expander 114 for each chip, interposer or package. A nozzle 116 is provided for each chip, interposer or package. In this embodiment, each chip, interposer or package includes a plurality of solder deposits 118 with a height $H_s'$. In an alternative embodiment, each chip, interposer or package may include a solderable surface.

Expander 114 is of an uncompressed height $H_u'$. Uncompressed height $H_u'$ of expander 114 may correspond to a desired height $H_d'$ of a solder joint. As discussed previously, expander 114 may be a corrugated strip, a linear compression spring or other resilient devices.

Referring next to FIG. 5b, expander 114 is compressed to a height $H_c'$ and brought into contact with substrate 102 when first mold half 106 is brought into contact with second mold half 110. Compressed height $H_c'$ of expander 114 is preferably less than height $H_s'$ of the plurality of solder deposits 118.

An encapsulant 120 in a molten state is injected into mold 104 through nozzle 116. Encapsulant 120 fills up a space 122 in second mold cavity 112 around expander 114.

Encapsulant 120 has a softening temperature that is approximately 40° C. higher than a melting point of the plurality of solder deposits 118. Such a softening temperature allows encapsulant 120 to remain rigid at a solder reflow temperature, that is, a temperature at which the plurality of solder deposits 118 are melted to form a solder joint, while softening at a temperature of approximately 10° C. above the solder reflow temperature. As discussed previously, encapsulant 120 may be a thermoplastic such as polyamide or polyacetal.

Mold 104 is allowed to cool once space 122 is filled. Upon cooling, encapsulant 120 solidifies to form elongator 100 with expander 114. Expander 114 is restrained in a compressed state by encapsulant 120. Consequently, elongator 100 is of a height $H_c'$ corresponding to height $H_c'$ of compressed expander 114. Because second mold cavity 112 is designed to accommodate a corresponding expander 114 for each chip, interposer or package, elongator 100 may be formed on each chip, interposer or package.

First mold half 106 is then separated from second mold half 110 as illustrated in FIG. 5c. Thereafter, substrate 102 with elongator 100 affixed thereto is removed from first mold cavity 108.

The use of an injection molding process is advantageous in that the injection molding process provides a quick and economical way of mass-producing elongator 100 on a plurality of interposers, a series of packages or a plurality of chips.

Although the injection molding process is used to form elongator 100 on substrate 102 in this embodiment, other processes such as compression molding, transfer molding and casting may also be employed.

Figure 6:
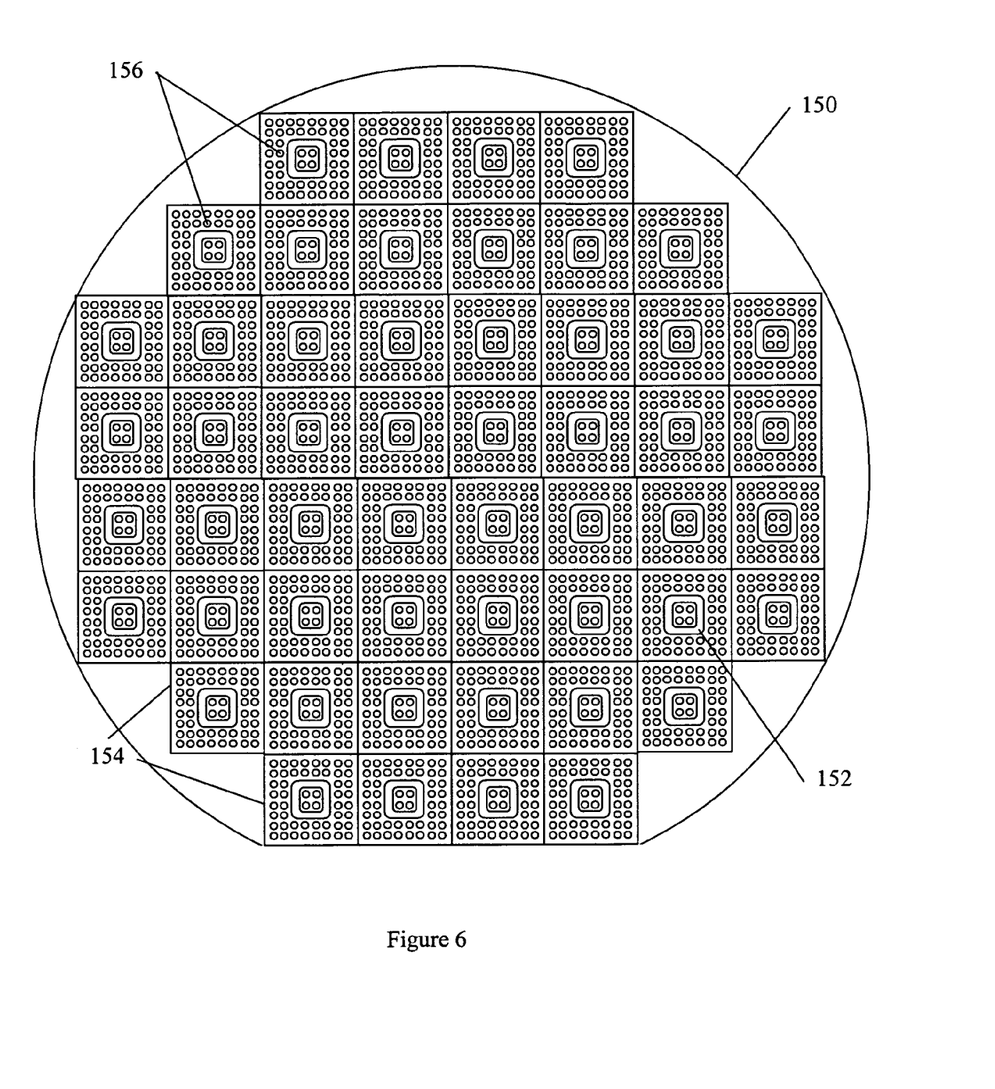
FIG. 6 illustrates a plan view of a wafer with an elongator affixed thereto in accordance with another embodiment of the present invention.

FIG. 6 illustrates a plan view of a wafer 150 with an elongator 152 affixed thereto in accordance with another embodiment of the present invention. Wafer 150 comprises a plurality of chips 154, each of which includes a plurality of solder deposits 156. Elongator 152 is coupled to an area on each of the plurality of chips 154 that is unpopulated by the plurality of solder deposits 156. Accordingly, the geometry of elongator 152 may correspond to an area on each of the plurality of chips 154 that is unpopulated by the plurality of solder deposits 156.

Wafer 150 may be separated into individual chips by scribing or sawing. Each individual chip may be used to elongate a solder joint with an interposer or a board using the method illustrated in FIGS. 4a to 4c.

Figure 7:
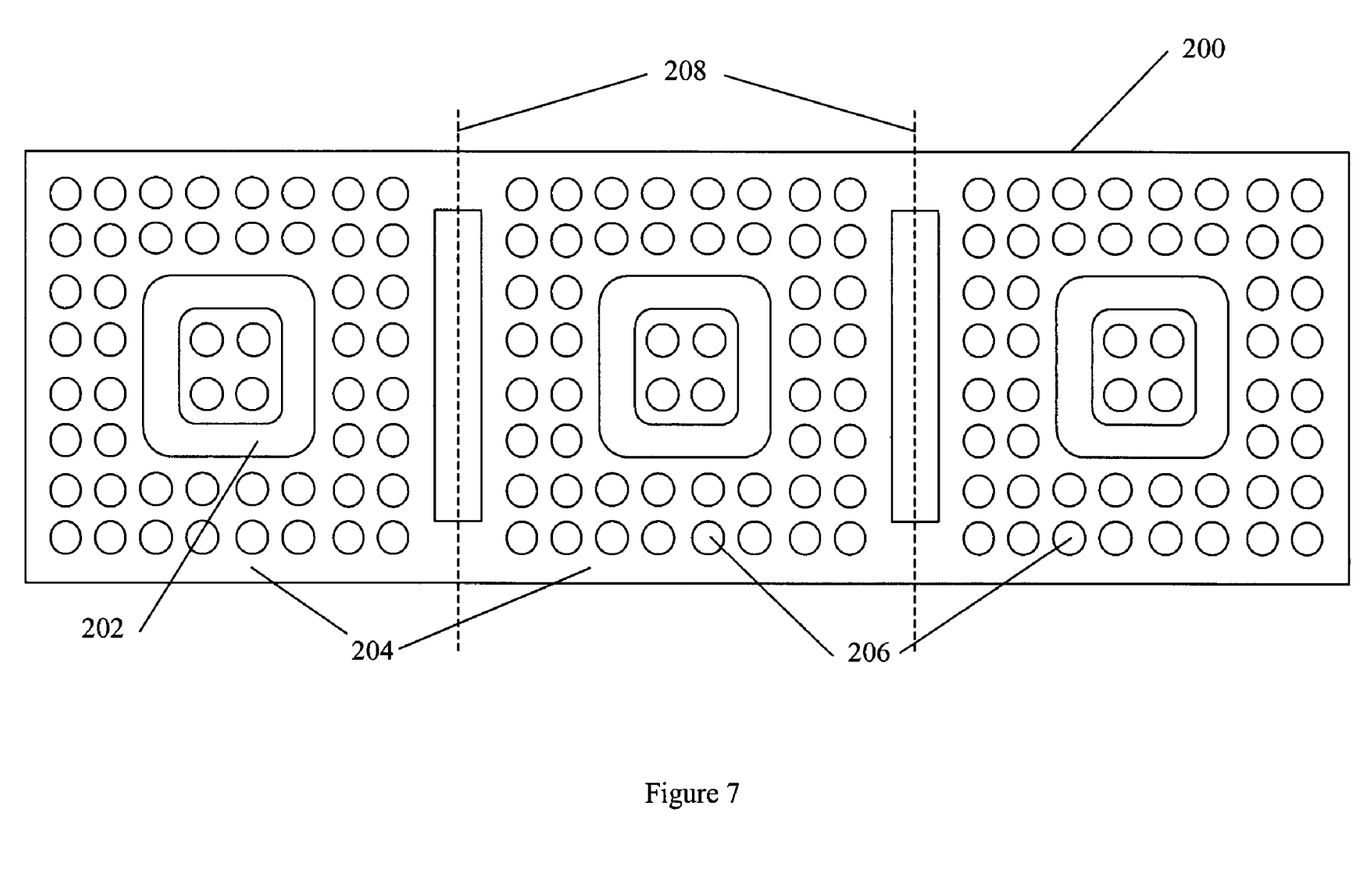
FIG. 7 illustrates a plan view of a series of interposers with an elongator affixed thereto in accordance with another embodiment of the present invention.

FIG. 7 illustrates a plan view of a series of interposers 200 with an elongator 202 affixed thereto in accordance with another embodiment of the present invention. The series of interposers 200 comprises a plurality of interconnected interposers 204, each of which includes a solderable surface 206. Elongator 202 is coupled to an area on each of the plurality of interconnected interposers 204 that is unpopulated by solderable surface 206. Accordingly, the geometry of elongator 202 may correspond to an area on each the plurality of interconnected interposers 204 that is unpopulated by solderable surface 206.

The series of interposers 200 may be subjected to singulation along a singulation line 208 to separate the plurality of interconnected interposers 204 into individual interposers. Each individual interposer may be used to elongate a solder joint with a chip using the method illustrated in FIGS. 4a to 4c.

Figure 8A:
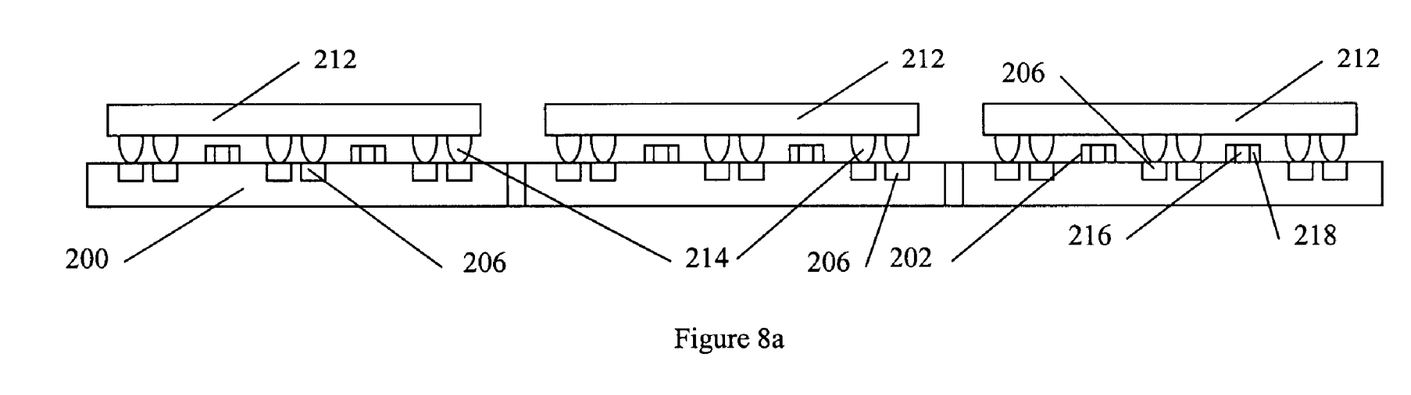
FIGS. 8a to 8c illustrate a method to elongate a solder joint in accordance with another embodiment of the present invention.
Figure 8B:
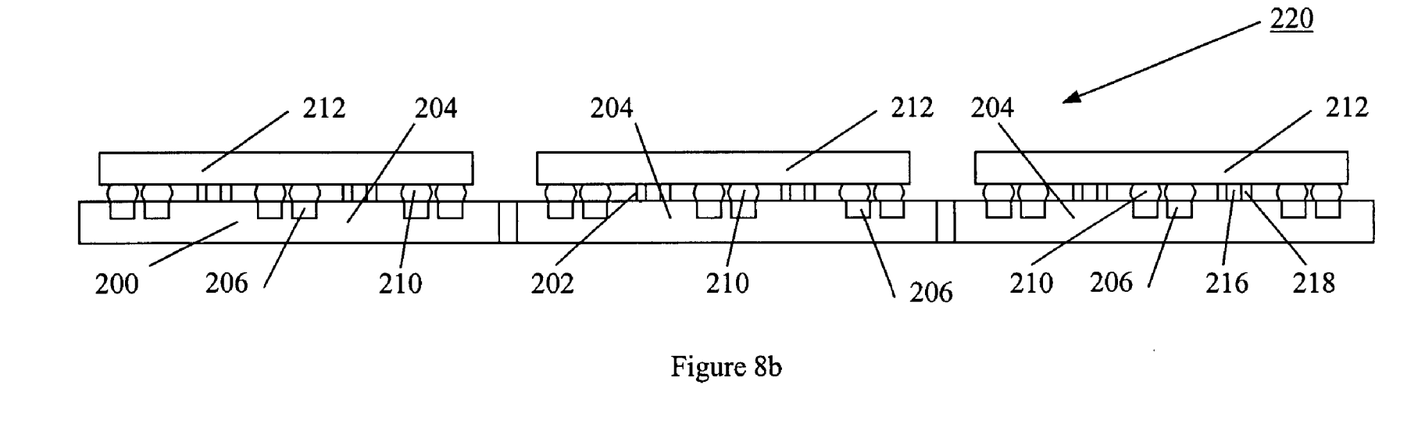
Figure 8C:
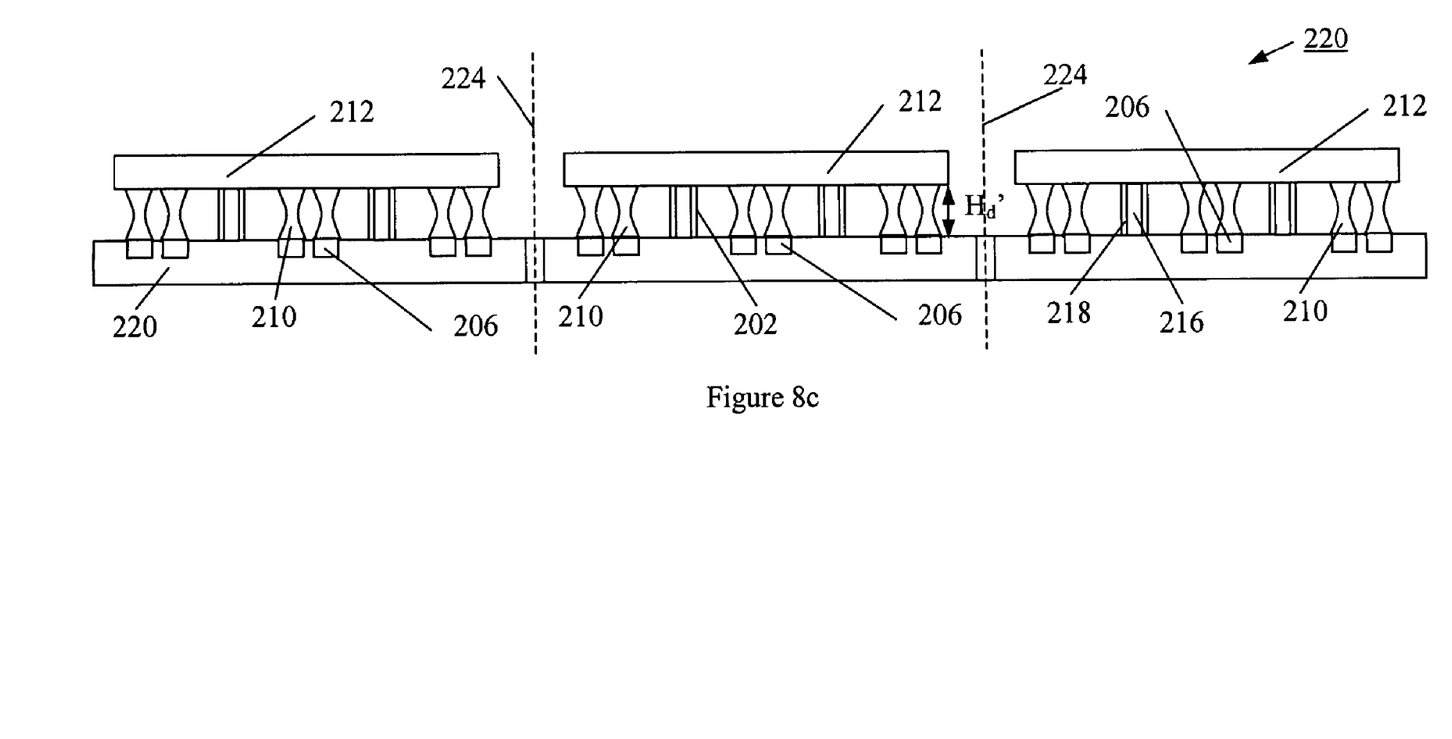

Alternatively, the series of interposers 200 may be used to elongate a solder joint 210 with a chip 212 prior to singulation as illustrated in FIGS. 8a to 8c. Referring first to FIG. 8a, solderable surface 206 is positioned to oppose a plurality of solder deposits 214 on chip 212.

Elongator 202 comprises an expander 216 encapsulated by an encapsulant 218. Expander 202 is restrained in a compressed state by encapsulant 218. Expander 216 may be a corrugated strip, a linear compression spring or other resilient devices. Encapsulant 218 has a softening temperature that is approximately 40° C. higher than a melting point of the plurality of solder deposits 214 and is preferably an electrical insulator such as polyamide and polyacetal.

Heat is applied to melt the plurality of solder deposits 214 via a reflow process. At a solder reflow temperature, that is, a temperature above the melting point of the plurality of solder deposits 214, each of the plurality of solder deposits 214 melts and wets a corresponding solderable surface 206, forming solder joint 210 as illustrated in FIG. 8b. Solder joint 210 couples each of the plurality of interconnected interposers 204 to chip 212 to form an electronic assembly 220.

Because the softening temperature of encapsulant 218 is higher than the solder reflow temperature, encapsulant 218 remains sufficiently rigid to prevent a release of expander 216 from its compressed state.

Electronic assembly 220 is then subjected to further heating to raise a reflow temperature to the softening temperature of encapsulant 218. At the softening temperature, encapsulant 218 begins to soften.

As encapsulant 218 softens, expander 216 is gradually released from its compressed state, resulting in a gradual elongation of solder joint 210. The rate at which solder joint 210 elongates depends on the compliance of expander 216 and the viscosity of encapsulant 218. The use of a more compliant expander 216 and a more viscous encapsulant 218 will result in a slower release of expander 216 from its compressed state, and a correspondingly slower rate of elongation.

With reference to FIG. 8c, electronic assembly 220 is cooled when solder joint 210 attains a desired height $H_d'$. Upon cooling, solder joint 210 and encapsulant 218 solidify. Elongator 202 serves as a reinforcement for solder joint 210, increasing its resistance to stress and strain caused by temperature cycling and to mechanical shock, thereby enhancing the reliability of solder joint 210.

The series of interposers 200 may then be singulated along a singulation line 224 to separate the series of interposers 200 into a plurality of individual electronic assemblies.

An advantage of the present invention is that it requires a minimal number of processing steps. Because an elongator is formed directly on one of the substrates forming an electronic assembly, no further processing steps are required to position and to affix the elongator to the substrate individually. By minimizing the number of processing steps required, manufacturing costs and the probability of defects in the solder joint are minimized.

Additionally, by forming the elongator directly on one of the substrates forming the electronic assembly, the manufacturing process is simplified as the elongator does not then require individual handling.

Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

The invention claimed is:

1. A method to elongate a solder joint, the method comprising:

forming an elongator on a first substrate, wherein the elongator comprises an expander and an encapsulant to encapsulate the expander, the encapsulant being comprised of a thermoplastic;

forming the solder joint to connect the first substrate to a second substrate; and softening the encapsulant to release the expander from a compressed state to elongate the solder joint.

2. The method to elongate a solder joint as recited in claim 1, wherein forming the elongator on the first substrate comprises:

providing a mold having a first mold cavity and a second mold cavity, wherein the first substrate is disposed in the first mold cavity and an expander is disposed in the second mold cavity;

compressing the expander; and introducing the encapsulant into the mold to encapsulate the expander to form the elongator on the first substrate.

3. The method to elongate a solder joint as recited in claim 2, further comprising:

singulating the first substrate.

4. The method to elongate a solder joint as recited in claim 3, wherein the first substrate is one of a group consisting of a series of interposers, a series of packages and a wafer.

5. The method to elongate a solder joint as recited in claim 2, wherein the first substrate is one of a group consisting of a chip, an interposer, a package, a board and a series of interposers.

6. The method to elongate a solder joint as recited in claim 1, wherein the elongator is formed on the first substrate by one of a group consisting of an injection molding process, a compression molding process, a transfer molding process and a casting process.

7. The method to elongate a solder joint as recited in claim 1, wherein the encapsulant is an electrical insulator.

8. The method to elongate a solder joint as recited in claim 1, wherein forming the solder joint to connect the first substrate to the second substrate comprises:

melting a plurality of solder deposits to wet a solderable surface to form the solder joint.

9. The method to elongate a solder joint as recited in claim 8, wherein the thermoplastic has a softening temperature of approximately 40° C. higher than a melting point of the plurality of solder deposits.

10. The method to elongate a solder joint as recited in claim 1, wherein the thermoplastic is one of a group consisting of polyamide and polyacetal.

11. The method to elongate a solder joint as recited in claim 1, wherein the expander comprises a corrugated strip.

12. The method to elongate a solder joint as recited in claim 11, wherein a first end of the corrugated strip overlaps a second end of the corrugated strip.

* * * * *